(12) United States Patent
Ghorpade et al.

(10) Patent No.: US 12,131,877 B2
(45) Date of Patent: Oct. 29, 2024

(54) POWER CONNECTION FOR SAFE ENERGIZING OF A POWER UNIT IN A MOTOR CONTROL CENTER

(71) Applicant: EATON INTELLIGENT POWER LIMITED, Dublin (IE)

(72) Inventors: Shriram Jayshankar Ghorpade, Maharashtra (IN); John A. Bordewick, Fayetteville, NC (US)

(73) Assignee: Eaton Intelligent Power Limited, Dublin (IE)

( * ) Notice: Subject to any disclaimer, the term of this patent is extended or adjusted under 35 U.S.C. 154(b) by 297 days.

(21) Appl. No.: 17/866,131

(22) Filed: Jul. 15, 2022

(65) Prior Publication Data

US 2024/0021384 A1 Jan. 18, 2024

(51) Int. Cl.
*H01H 21/22* (2006.01)
*H05K 5/02* (2006.01)

(52) U.S. Cl.
CPC ........... *H01H 21/22* (2013.01); *H05K 5/0217* (2013.01)

(58) Field of Classification Search
CPC .... H01H 9/22; H01H 9/226; H01H 2071/006; E05C 19/003; E05C 19/10; E05C 21/00; H02B 11/26; H02B 11/173; H02B 1/36; H02B 11/24; H02B 11/127; H02B 11/133; H02B 1/38; H02B 1/21; H02B 1/32; H02B 1/46; H02B 1/48; H02B 11/10; H02B 11/12; H02B 11/167; H02B 1/14; H02B 1/306; H02B 3/00
See application file for complete search history.

(56) References Cited

U.S. PATENT DOCUMENTS

| 4,024,441 | A | 5/1977 | Coyle et al. |
| 4,789,919 | A | 12/1988 | Cox et al. |
| 10,742,004 | B2 * | 8/2020 | Kroushl ................... H02B 1/14 |
| 11,177,088 | B2 | 11/2021 | Tyleshevski et al. |
| 2013/0077210 | A1 | 3/2013 | Morris |
| 2015/0114807 | A1 * | 4/2015 | Benke .................. H02B 11/127 |
| | | | 200/50.23 |
| 2020/0273639 | A1 * | 8/2020 | Tyleshevski ............. H02B 1/36 |

FOREIGN PATENT DOCUMENTS

| WO | 2015047307 A1 | 4/2015 |
| WO | 2019120622 A1 | 6/2019 |

* cited by examiner

*Primary Examiner* — Ahmed M Saeed
(74) *Attorney, Agent, or Firm* — Baker Botts L.L.P.

(57) ABSTRACT

A power unit in a motor control center comprises an extendable/retractable carriage assembly and a power connection configurable to prevent an operator from accidentally energizing the power unit. A carriage follower coupled to the carriage assembly and in contact with a rotatable linkage may rotate the rotatable linkage to position an operator handle blocking surface. In a blocking position, the blocking surface prevents rotation of an operator handle to an operator handle position associated with energizing the power unit and in a nonblocking position, the blocking surface allows rotation of the operator handle to the operator handle position associated with energizing the power unit.

20 Claims, 8 Drawing Sheets

POWER CONNECTION FOR SAFE ENERGIZING OF A POWER UNIT IN A MOTOR CONTROL CENTER

FIELD OF THE INVENTION

The present invention relates to power units in motor control systems and more particularly to safely energizing power units in a motor control center.

BACKGROUND OF THE INVENTION

As is known to those of skill in the art, a Motor Control Center (MCC) can include cabinets or enclosures that hold multiple, typically modular, bucket assemblies of various sizes. See, e.g., U.S. Pat. No. 4,024,441, the contents of which are hereby incorporated by reference as if recited in full herein. Eaton Corporation introduced an MCC product line with compact bucket assemblies that conveniently plug into a slot or space in an MCC cabinet. The product is sold under the product name, Freedom 2100 MCC. See also, U.S. Patent Application Publication Serial Number US2013/0077210, the contents of which are hereby incorporated by reference as if recited in full herein.

MCCs are used, for example, in some commercial and industrial applications to distribute electrical power to a variety of loads (e.g., without limitation, relatively high-power electrical motors, pumps, and other loads).

A power unit (also referred to as a "bucket" or "bucket assembly") may be installed in a MCC cabinet, wherein a set of power connectors (also referred to as "stabs") may be connected to a set of power buses (also referred to as "bus bars" or "vertical buses") and a power switch may be actuated from an OFF/Off position to an ON/On position to energize the power unit (i.e., supply electric power to components in the power unit).

Despite the above, there remains a need for alternate power unit configurations.

SUMMARY OF EMBODIMENTS OF THE INVENTION

Embodiments of the invention provide power units with a power connection for allowing an operator to safely install the power unit, connect a set of power connectors to a set of power buses, and energize the power unit.

Embodiments of the invention may be directed to a power connection for a power unit associated with a motor control center. The power unit may comprise a carriage assembly comprising a set of power connectors for connection to a set of power buses, a power switch for energizing the power unit when the set of power connectors are fully connected to the set of power buses, and a front panel encasing the power switch. The power connection may comprise an operator handle extending from the front panel, a carriage follower rigidly connected to the carriage assembly, wherein movement of the carriage assembly causes movement of the carriage follower, a rotatable linkage comprising a first interface with a positioning surface in contact with the carriage follower, wherein movement of the carriage follower causes movement of the rotatable linkage, and a second interface of the rotatable linkage coupled to the first interface, the second interface comprising an operator handle blocking surface. The operator handle may be rotatable to an operator handle position, wherein an operator handle first position corresponds to the carriage assembly being in a position corresponding to the set of power connectors not in contact with the set of power buses, an operator handle second position corresponds to the set of power connectors positioned just touching the set of power connectors and an operator handle third position corresponds to the set of power connectors being fully connected to the set of power buses.

If the carriage assembly is in an extended position corresponding to the set of power connectors being fully connected to the set of power buses, contact between the positioning surface and the first interface causes rotation of the rotatable linkage to position the operator handle blocking surface in a nonblocking position, wherein the operator handle is rotatable to the operator handle third position. If the carriage assembly is in a retracted position corresponding to the set of power connectors not being fully connected to the set of power buses, the rotatable linkage positions the operator handle blocking surface in a blocking position, wherein the operator handle blocking surface prevents rotation of the operator handle to the operator handle third position. If the set of power connectors are not fully connected to the set of power buses, rotation of the operator handle from the operator handle first position toward the operator handle third position causes the operator handle extension to contact the operator handle blocking surface, wherein the operator handle blocking surface prevents rotation of the operator handle to the operator handle third position.

In some embodiments, the carriage follower is configurable for contact with the first interface such that the set of power connectors must be fully connected to the set of power connectors to enable rotation of the rotatable linkage to position the operator handle blocking surface in the unblocked position. In some embodiments, a length of the carriage follower is configurable such that advancing the carriage assembly to an extended configuration causes rotation of the rotatable linkage to position the operator handle blocking surface in the nonblocking position.

In some embodiments, the power connection comprises a spring with a spring force selected to bias the rotatable linkage toward the blocking position, wherein advancing the carriage assembly overcomes the spring force to orient the rotatable linkage in the nonblocking position. In some embodiments, the rotatable linkage is rotatable around a first pivot and the positioning surface is curved to have correct travel of carriage assembly.

In some embodiments, the operator handle is coupled to a switch actuator, wherein rotation of the operator handle to the operator handle third position causes the switch actuator to configure the power switch to energize the power unit. In some embodiments, the power connection further comprises a handle extension coupled to the operator handle and the switch actuator, wherein a change in the operator handle position causes a proportional change in an angular position of the handle extension. In some embodiments, the handle extension is fixed at an angle relative to the operator handle.

Embodiments of the invention may be directed to a power unit for a motor control center having a set of power buses. The power unit may comprise a carriage assembly comprising a set of power connectors for connection to a set of power buses, a power switch configurable for energizing the power unit when the set of power connectors are fully connected to the set of power buses, a front panel encasing the power switch, an operator handle extending from the front panel, wherein the operator handle is rotatable to an operator handle position, a carriage follower rigidly connected to the carriage assembly, wherein movement of the carriage assembly causes movement of the carriage follower, and a rotatable linkage comprising a first interface with a positioning surface in contact with the carriage follower, wherein movement of the carriage follower causes rotation of the rotatable linkage, the rotatable linkage further comprising a second interface with an operator handle blocking surface. An operator handle first position corresponds to the carriage assembly being in a position corresponding to the set of power connectors not in contact with the set of power buses, an operator handle second position corresponds to the set of power connectors being positioned just touching the set of power connectors and an operator handle third position corresponds to the set of power connectors being fully connected to the set of power buses.

As the carriage assembly is advanced to an extended position corresponding to the set of power connectors being fully connected to the set of power buses, contact between the carriage follower and the positioning surface of the first interface causes rotation of the rotatable linkage to position the operator handle blocking surface in a nonblocking position, wherein the operator handle is rotatable to the operator handle third position. If the carriage assembly is in a retracted position corresponding to the set of power connectors not being fully connected to the set of power buses, the rotatable linkage is positioned such that the operator handle blocking surface is in a blocking position, wherein the operator handle blocking surface prevents rotation of the operator handle to the operator handle third position. In some embodiments, a spring coupled to the carriage follower and a housing of the power unit biases the rotatable linkage to position the operator handle blocking surface in a blocking position.

Embodiments of the invention may be directed to a method for connecting a power unit to a set of power buses in a motor control center, the power unit comprising a set of power connectors for connecting to the set of power buses, a unit housing comprising components, a power switch configurable for energizing the power unit when the set of power connectors are fully connected to the set of power buses, and a front panel encasing the power switch. The method may comprise positioning a power unit relative to the set of power buses, wherein the power unit comprises a carriage assembly comprising a set of power connectors for connection to the set of power buses, wherein the power unit may be installed relative to the set of power buses with the carriage assembly in a retracted configuration to prevent connection of the set of power connectors to the set of power buses. The power unit further comprises an operator handle extending from the front panel, wherein the power unit may be installed with the operator handle in an operator handle first position corresponding to the set of power connectors not in contact with the set of power buses, a carriage follower rigidly connected to the carriage assembly, wherein movement of the carriage assembly causes movement of the carriage follower. The power unit further comprises a rotatable linkage comprising a first interface with a positioning surface for contact with the carriage follower, wherein movement of the carriage follower causes movement of the rotatable linkage, and a second interface coupled to the first interface, wherein the second interface comprises an operator handle blocking surface. The rotatable linkage is rotatable to position the operator handle blocking surface in a blocking position to prevent rotation of the operator handle to an operator handle second position corresponding to the set of power connectors positioned near the set of power buses. If the set of power connectors are not fully connected to the set of power buses, rotation of the operator handle from the operator handle first position toward the operator handle third position causes the operator handle to contact the operator handle blocking surface to prevent rotation of the operator handle to the operator handle third position.

The method further comprises advancing the carriage assembly to fully connect the set of power connectors to the set of power buses, wherein the rotatable linkage positions the operator handle blocking surface in a nonblocking position such that the operator handle is rotatable to an operator handle third position to energize the power unit.

In some embodiments, the operator handle is coupled to a switch actuator coupled to the power switch, wherein rotation of the operator handle to the operator handle third position causes the switch actuator to actuate the power switch to energize the power unit. In some embodiments, the operator handle further comprises a handle extension coupled to the switch actuator, wherein a change in the operator handle position causes a proportional change in an angular position of the handle extension. In some embodiments, the carriage follower has a length configurable such that the carriage assembly causes rotation of the rotatable linkage to position the operator handle blocking surface in the nonblocking position only if the set of power connectors are fully connected to the set of power buses.

Further features, advantages and details of the present invention will be appreciated by those of ordinary skill in the art from a reading of the figures and the detailed description of the preferred embodiments that follow, such description being merely illustrative of the present invention.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

DETAILED DESCRIPTION OF EMBODIMENTS OF THE INVENTION

Figure 1:
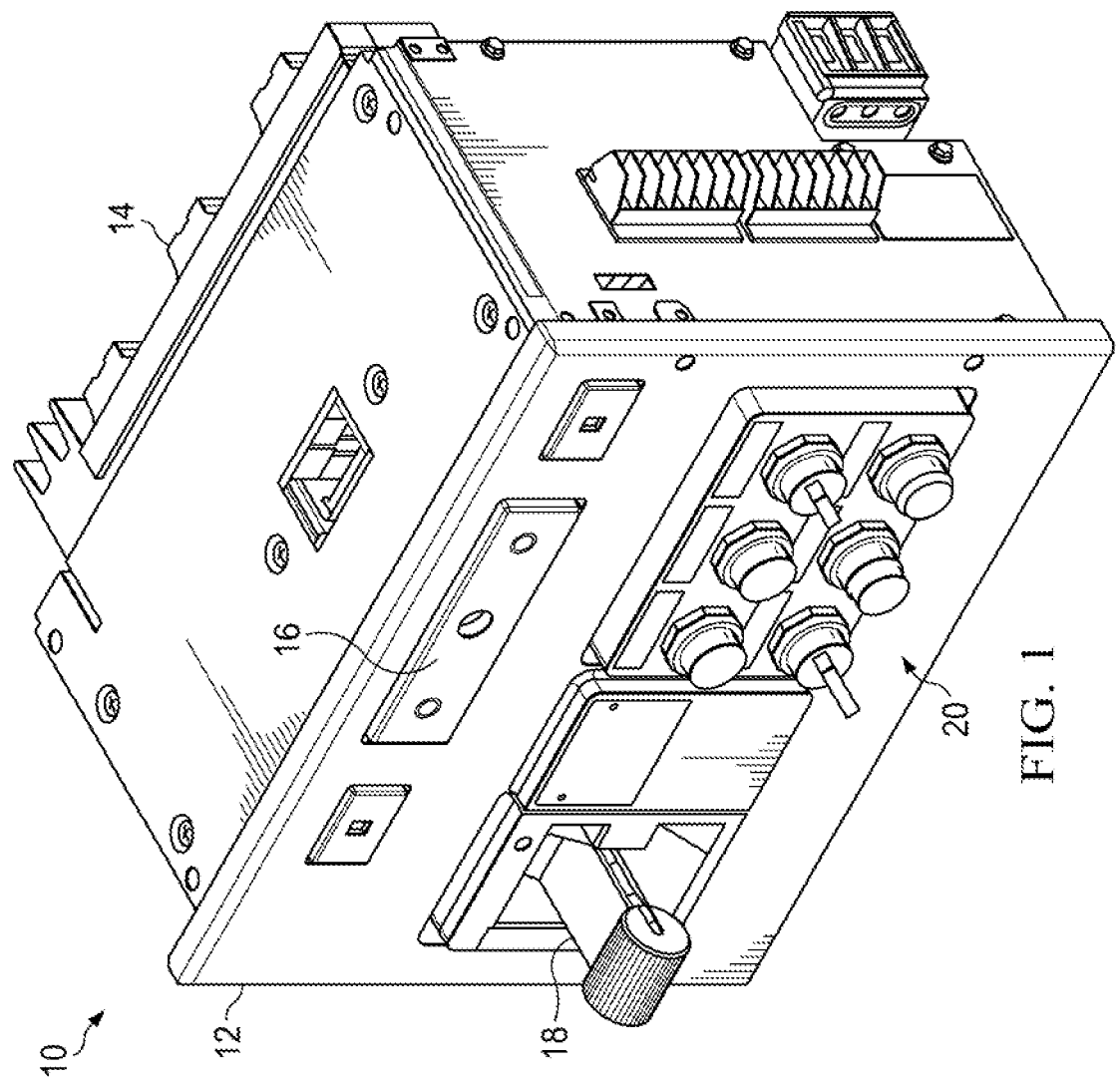
FIG. 1 is a partial front perspective view of an exemplary Motor Control Unit for use in a Motor Control Center (MCC).

The present invention now will be described more fully hereinafter with reference to the accompanying drawings, in which illustrative embodiments of the invention are shown. Like numbers refer to like elements and different embodiments of like elements can be designated using a different number of superscript indicator apostrophes (e.g., 10, 10', 10", 10'").

The term "Fig." (whether in all capital letters or not) is used interchangeably with the word "Figure" as an abbreviation thereof in the specification and drawings. In the figures, certain layers, components or features may be exaggerated for clarity, and broken lines illustrate optional features or operations unless specified otherwise. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

The term "about" refers to numbers in a range of +/−20% of the noted value.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

In the present disclosure, the terms "bucket" or "unit" are used interchangeably and are intended to mean a motor control center unit that may be configured to be a removable modular unit capable of being installed behind individual or combined sealed doors on the motor control center enclosure. The unit may contain various motor control and motor protection components such as motor controllers, starters, contactor assemblies, overload relays, circuit breakers, motor circuit protectors, various disconnects, and similar devices for electric motors. The unit is configured to connect to a common power bus of the motor control center and conduct supply power to the line side of the motor control devices for operation of motors or feeder circuits.

Motor control units may be configured as "starter units" for supplying power to and/or controlling electrical motors and pumps or as general "feeder units" for supplying feeder circuits. The terms "bucket assembly", bucket" and "unit" are used interchangeably and refer to a housing 12 (typically having sides of a protective metal shell) that contains either a power switch with a fuse or a circuit breaker for turning power ON/On and OFF/Off to a motor, or feeder circuit, typically for controlling power to motor starters. As noted above, the bucket or power unit 10 can be a feeder unit or a starter unit. A power unit 10 can include other components such as a power transformer, a motor starter to control a single motor and PLCs (programmable logic controllers), drives and the like. A power unit 10 can be configured as a modular device to allow the internal components to be assembled as a unit that can be easily installed into a Motor Control Center (MCC) compartment. As is well known, power unit 10 can have a set of power connectors 14 that can extend out of the back of housing 12 that connect to power buses 30 (also referred to as "bus bars") that carry power (current) to the compartments of a vertical section in an MCC cabinet. The power buses 30 are connected to larger horizontal bus bars that bring power to the vertical sections. The horizontal bus bars are usually in the top, but some MCC designs may have them in the center or bottom.

A "feeder unit" refers to a motor control center unit for supplying feeder circuits. A feeder unit may have one or more feeders or power supply lines to supply feeder circuits or devices. A feeder unit (also called a "feeder") can have a "line side", which refers to the side of the feeder configured to be directly or indirectly connected to the common power bus of the motor control center. A feeder can also have a "load side", which refers to the side of the feeder configured to be connected to and deliver current to a feeder circuit. A feeder may comprise a circuit breaker, a fuse and disconnect switch, or another configuration. The terms "feeder circuit" and "feeder device" are used interchangeably and are intended to mean circuits or devices connected to feeder units or "feeders".

A disconnect switch such as a "circuit breaker", "breaker", "disconnect switch and fuse", "molded case circuit breaker", "MCCB" are devices designed to open and close a circuit, typically allowing both manual open and close operation and automatic circuit interruption, the latter to open a circuit under certain conditions, e.g., an overcurrent. The disconnect switch can be for a motor starter unit or feeder unit, for example.

The terms "motor", "load", and "load device" are used interchangeably and are intended to mean devices bearing electrical load that are connected to and controlled by the motor control center. Load devices are typically motors but may also be pumps or other machinery that may comprise motors or pumps. Load devices may be connected to starter units.

The terms "operating mechanism" and "operator mechanism" are used interchangeably and refer to an assembly for moving contacts in a switching mechanism between first and second positions in a circuit and/or for opening and closing separable main contacts, in a disconnect circuit such as a circuit breaker or for turning power ON and OFF using a switch associated with a fuse as a disconnect.

MCCs usually have a wire way for wires from respective units 10 to the motors and other loads and control wires. U.S. Patent Application Publication 2013/0077210 describes an MCC with both right and left side wireways, the contents of which are hereby incorporated by reference as if recited in full herein. The wireways are typically provided as an enclosed space in an MCC cabinet proximate but outside stacked units. MCCs can be configured in many ways. Each compartment can have a different height to accept different frame sizes of respective bucket assemblies or units 10, typically in about 6-inch increments. The vertical bus can be omitted or not run through the full height of the section to accommodate deeper buckets for larger items like variable frequency drives. The MCC can be a modular cabinet system for powering and controlling motors or feeder circuits. Several may be powered from main switchgear which, in turn, gets its power from a transformer attached to the incoming line from the power company. A typical MCC cabinet is an enclosure with a number of small doors arranged in rows and columns along the front. The back and sides are typically flat and mostly featureless. The buckets can be provided in varying sizes. For starter units, the size can be based on the size of the motor they are controlling. The bucket assembly can be configured to be relatively easily removable for repair, service or replacement. MCCs can have regular starters, reversing starters, soft start, and variable frequency drives. MCCs can be configured so that sections can be added for expansion if needed. The buckets or units 10 of a motor control center 100 can have the same or different configurations.

The terms "right side" and "left side" refer to when a bucket assembly 10 is viewed from the front, e.g., the front is associated with front plate 20 of housing 12 when unit 10 is in an orientation shown in FIG. 1, for example, such that operator handle 18 is facing forward and the disconnect connectors (or "power connectors") 14 are facing rearward as shown.

The term "compact" refers to power units 10 held in a condensed configuration (package) relative to conventional units/buckets. A MCC structure or cabinet may be designed to receive multiple power units 10 ranging in various defined sizes. Power units 10 can be provided in package or frame sizes of about 6 inches to about 72 inches (tall) with substantially common depth and width dimensions, known as 1× (6 inches) to 12× (72 inches) sizes. The sizes can be in single × increments, from 1×, 2×, 3×, 4×, 5×, 6×, 7×, 8×, 9×, 10×, 11× and 12×. Thus, a 5× MCC unit can be about 30 inches tall. The frame sizes can be provided for a plurality of amperages, including a plurality of: 125A, 150A, 225A, 250A, 400A, 600A, 1200A and 2000A, for example. A power unit 10 is typically about 7 inches deep but larger or smaller sizes may be appropriate in some embodiments.

Referring to FIG. 1, power unit 10 may comprise housing 12 with front panel 20, carriage assembly actuator 16 and operator handle 18, and may include lights, switches or other actuators as well. Carriage assembly actuator 16 enables a user to advance or retract power connectors 14. Operator handle 18 may be rotated up or down to energize power unit 10 when power unit 10 is connected to a set of power buses or to de-energize power unit 10. Front panel 20 may include visual indicia (e.g., text, graphics) identifying an angular position of operator handle 18. When power unit 10 is installed, power connectors 14 might not be visible from a front of housing 12. As such, an operator of power unit 10 may not know if power connectors 14 are fully connected to a set of power buses such that power unit 10 can be safely energized.

Figure 2:
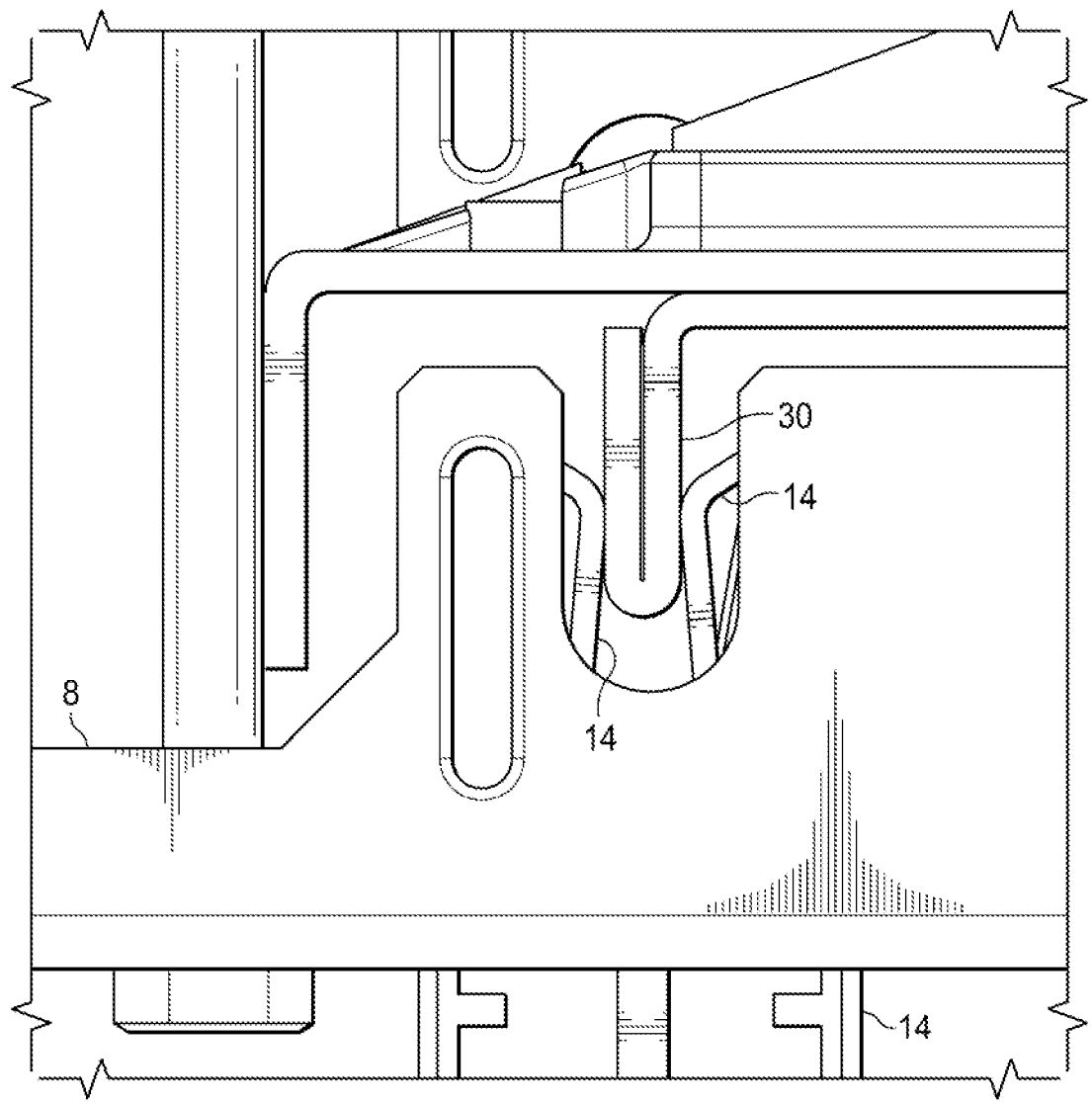
FIG. 2 is a top closeup view of a portion of a power connection, illustrating a power connector fully connected to a power bus.

FIG. 2 depicts a close-up partial view of carriage assembly 8 in an extended position such that a set of power connectors 14 are fully connected to a set of power buses 30. In this configuration, operator handle 18 may be rotated to an ON position such that power unit 10 is energized. As used herein, the term "fully connected" may refer to a configuration in which all power connectors 14 are in contact with all power buses 30 and each power connector 14 is in contact with a power bus 30.

Figure 3:
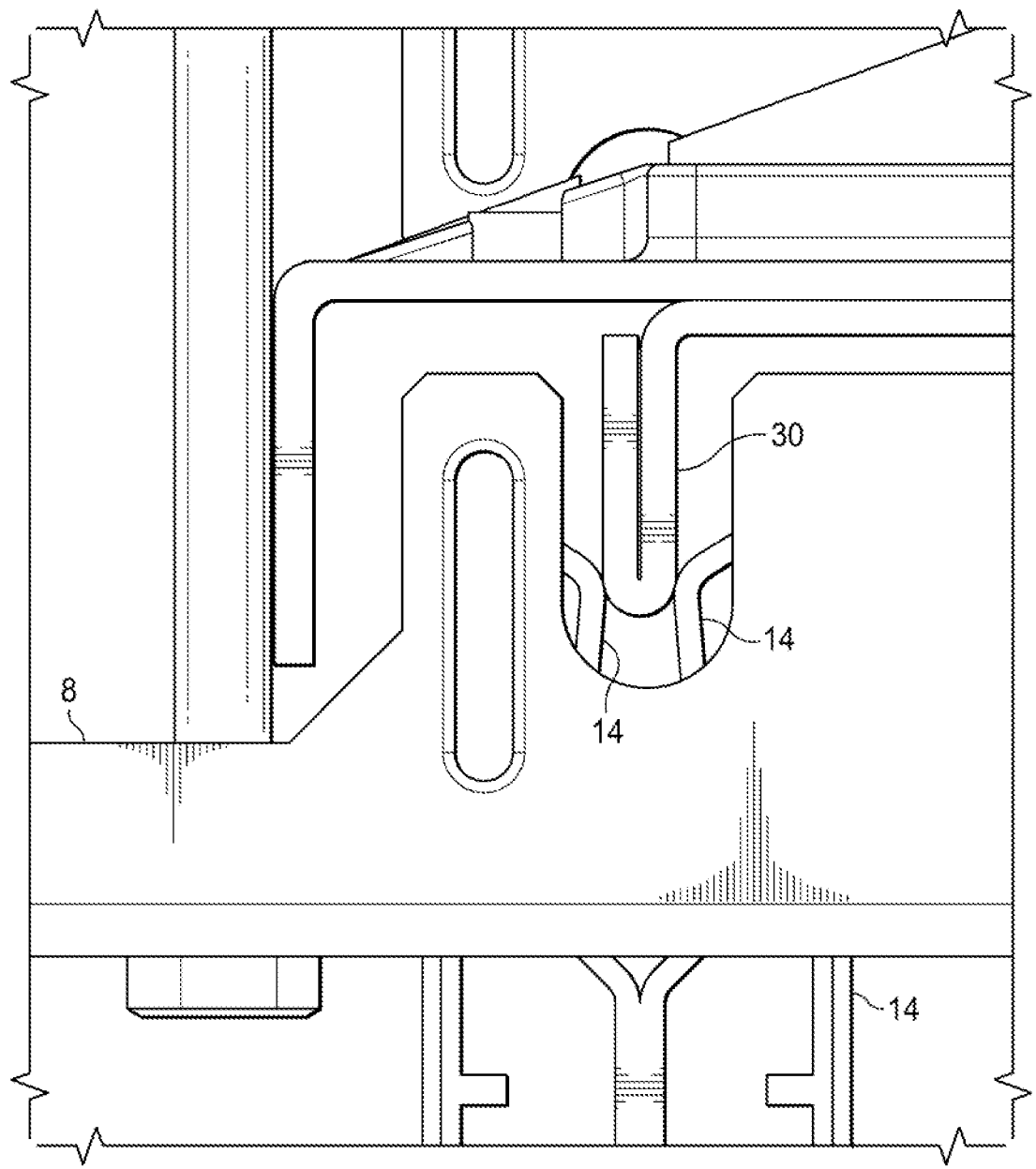
FIG. 3 is a top closeup view of a portion of a power connector, illustrating a power connector not fully connected to a power bus.

FIG. 3 depicts a close-up partial view of carriage assembly 8 in a configuration such that a set of power connectors 14 may be just touching the set of power buses 30. In other scenarios (not shown), one or more (but not all) power connectors 14 may be in contact with (but not fully connected to) one or more (but not all) power buses 30. If an operator rotates operator handle 18 to an ON position when the set of power connectors 14 are not fully connected to the set of power buses 30, arcing and other unwanted events can occur that might result in damage to power unit 10 and possible harm to an operator, technician or other person.

Embodiments disclosed herein comprise a power connection configured to allow rotation of operator handle 18 to energize power unit 10 only when a set of power connectors 14 is fully connected to a set of power buses 30.

Figure 4:
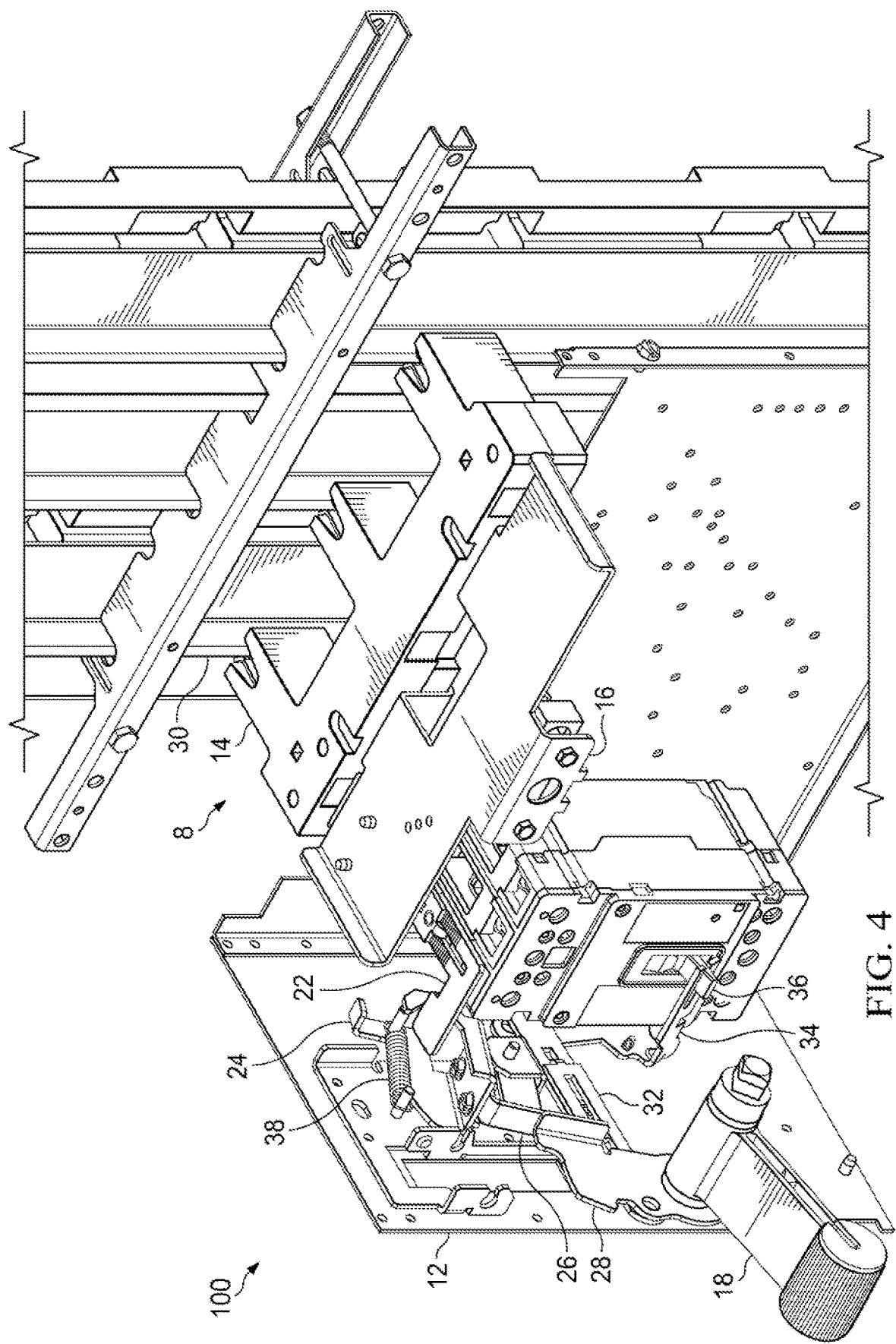
FIG. 4 is a perspective cutaway view of an embodiment of a power connection for the Motor Control Unit shown in FIG. 1.

FIG. 4 depicts a partial cutaway view of power unit 10 with front panel 20 and selected components removed, showing carriage assembly 8 with a set of three power connectors 14 for connecting to a set of three power buses 30 and switch linkage 32 and switch actuator 34 coupled to operator handle 18. To prevent accidental rotation of power switch 36 before power unit 10 is configured with power connectors 14 fully connected to power buses 30, power unit 10 may be installed with carriage assembly 8 in a retracted position such that power connectors 14 do not contact power buses 30. FIG. 4 further depicts power connection 100 for preventing a user from rotating operator handle 18 to actuate power switch 36 unless power connectors 14 are fully connected to power buses 30.

Power connection 100 may comprise carriage follower 22 coupled to carriage assembly 8, rotatable linkage 24 comprising contact surface 40 for contact with carriage follower 22 and operator handle blocking surface 46, wherein rotatable linkage 24 may be rotatable about pivot 52 for selective positioning of operator handle blocking surface 46. In some embodiments, operator handle 18 may comprise operator handle extension 28 coupled to switch linkage 32 and power switch actuator 34 for actuating power switch 36. In some embodiments, spring 38 may be coupled to rotatable linkage 24 to bias rotatable linkage 24 with operator handle blocking surface 46 in a blocking position, discussed in greater detail below.

Figure 5:
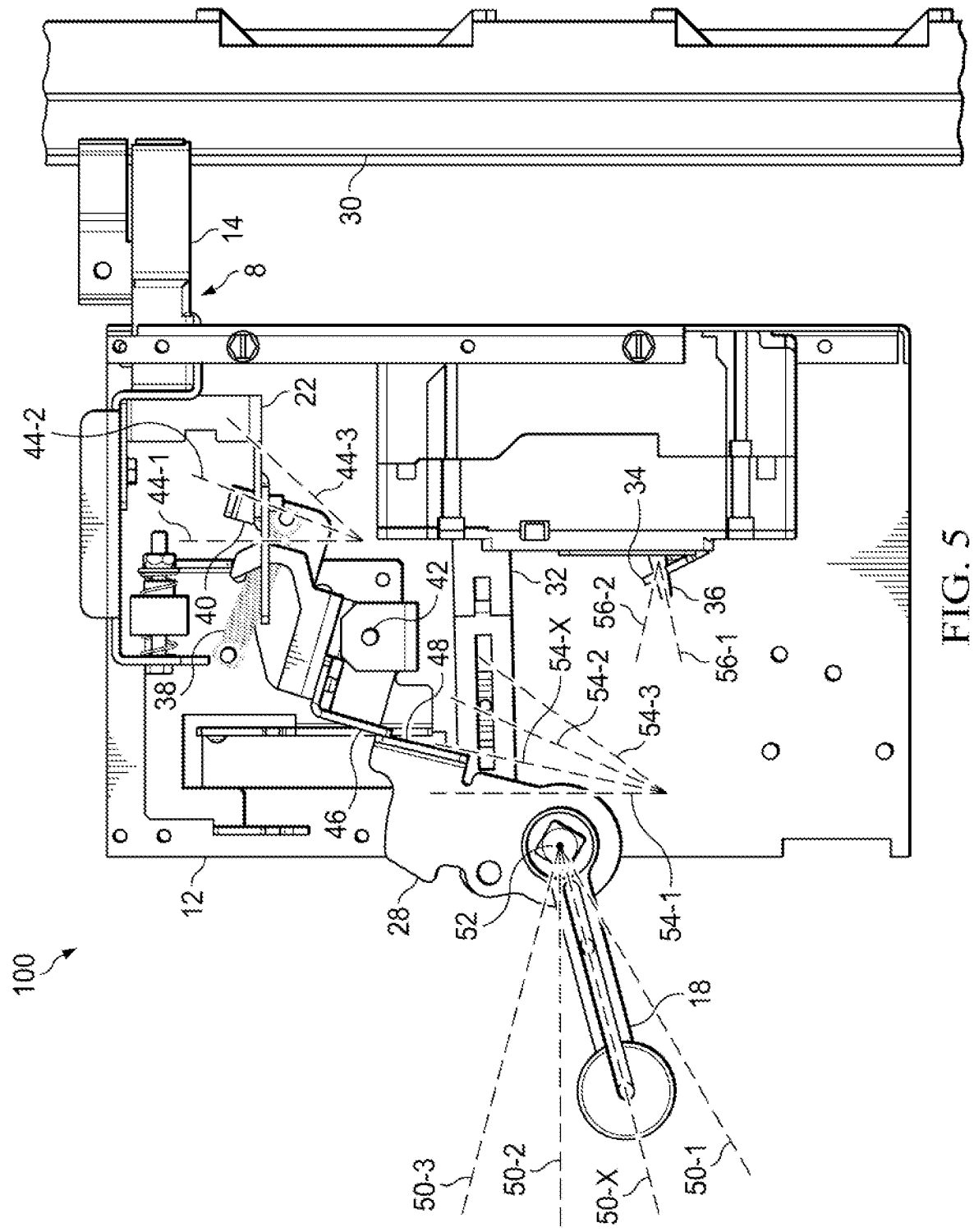
FIG. 5 is a side cutaway view of the embodiment of a power connection depicted in FIG. 2 in a configuration in which the operator handle is prevented from being rotated to an operator handle position associated with energizing the power unit.
Figure 6:
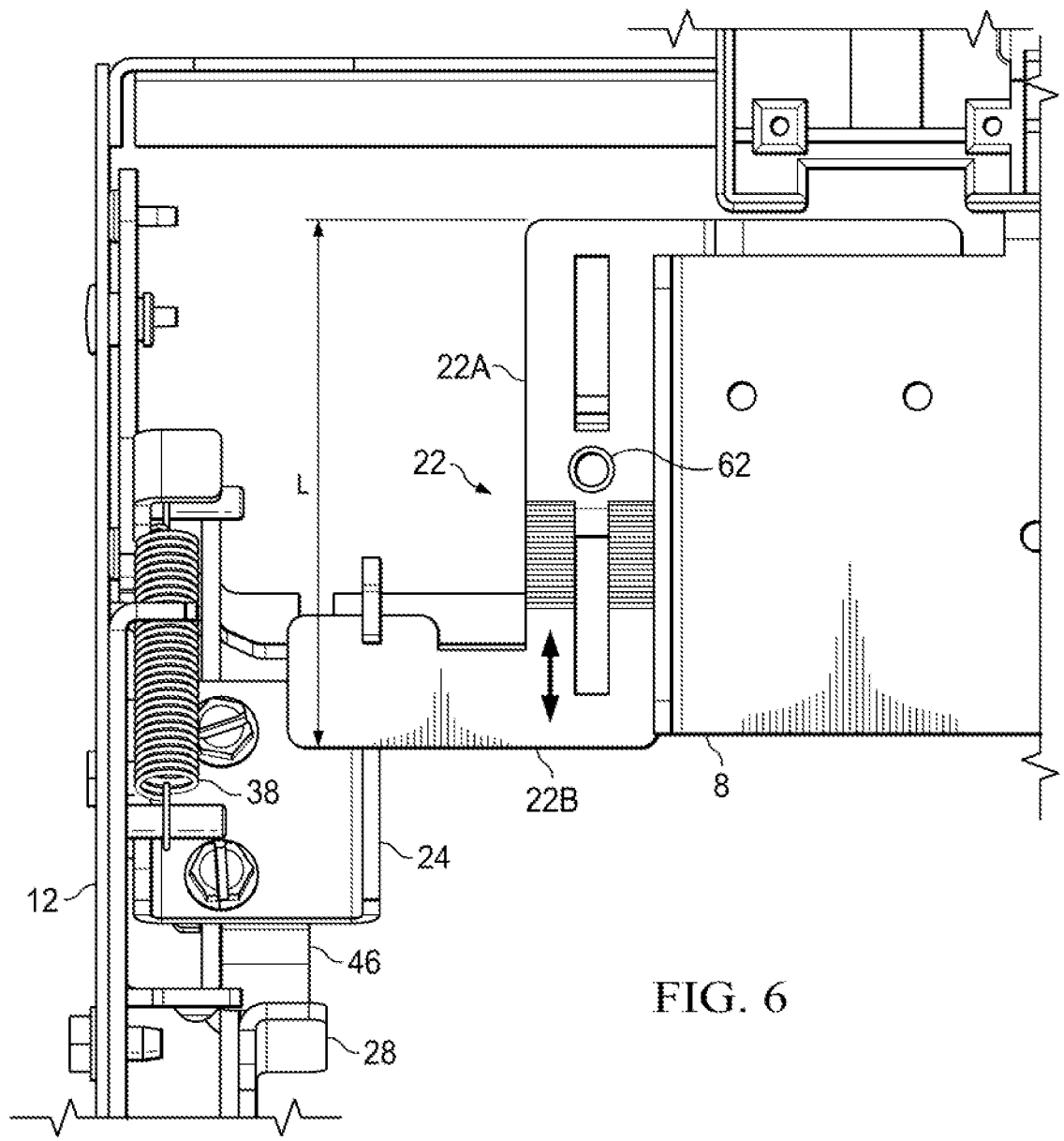
FIG. 6 is a top partial view of the embodiment of a power connection depicted in FIG. 2, illustrating contact between a rotatable linkage and a carriage follower coupled to a carriage assembly.

Referring to FIGS. 4, 5 and 6, carriage follower 22 may be fixedly coupled to carriage assembly 8 and in contact with positioning surface 40 of rotatable linkage 24 such that advancing carriage assembly 8 toward power buses 30 causes movement of carriage follower 22 and rotation of rotatable linkage 24. Carriage follower 22 may have a configurable length (L) such that, when carriage assembly 8 is in an extended configuration to fully connect a set of power connectors 14 with a set of power buses 30, rotatable linkage 24 is at a selected position (e.g., first carriage follower position 44-3), discussed in greater detail below.

Referring to FIG. 5, operator handle 18 (or operator handle extension 28 coupled to operator handle 18) may be coupled to switch linkage 32 and switch actuator 34, wherein rotation of operator handle 18 actuates power switch 36. Power unit 10 may be de-energized if operator handle 18 is rotated from operator handle third position 50-3 to operator handle first position 50-1. When power unit 10 is installed in an MCC but before a set of power connectors 14 are fully connected to a set of power buses 30, operator handle 18 may be in operator handle first position 50-1, indicating power unit 10 is not energized. If power unit 10 is installed, an operator might attempt to energize power unit 10 by rotating operator handle 18 to operator handle third position 50-3. Energizing power unit 10 before a set of power connectors 14 are fully connected to a set of power buses 30 may be dangerous. Referring to FIGS. 3-5, to prevent unwanted rotation of operator handle 18 to an operator handle third position 50-3 before power connectors 14 are fully connected to power buses 30, power unit 10 may be installed in an MCC with power connectors 14 in a retracted configuration (e.g., carriage assembly 8 may be configured such that a set of power connectors 14 will not contact a set of power buses 30) and power connection 100 may be configured to prevent operator handle 18 from being rotated to any operator handle position 50-X between operator handle position 50-2 and operator handle position 50-3, discussed in greater detail below.

To safely energize power unit 10, a user such as a technician may operate carriage assembly actuator 16 to advance carriage assembly 8 to an extended configuration such that a set of power connectors 14 is fully connected to a set of power buses 30. For example, carriage assembly actuator 16 may comprise a screw mechanism, wherein rotation of carriage assembly actuator 16 in a first direction may advance carriage assembly 8 towards power buses 30 and rotation of carriage assembly actuator 16 in an opposite direction may retract carriage assembly 8 such that a set of power connectors 14 do not contact a set of power buses 30.

If carriage assembly 8 is advanced toward power buses 30, contact between carriage follower 22 and rotatable linkage 24 causes rotation of rotatable linkage 24 around pivot 42. In some embodiments, as carriage assembly 8 is advanced towards power buses 30, contact between carriage follower 22 and rotatable linkage 24 may cause rotatable linkage 24 to rotate around pivot 42 to a rotatable linkage position 44 between rotatable linkage positions 44-1 and 44-3. For example, when power unit 10 is initially installed, carriage assembly 8 may be in a fully retracted configuration such that contact between contact surface 40 and carriage follower 22 may be at a first rotatable linkage position 44-1.

As carriage assembly 8 is advanced to position the set of power connectors 14 relative to the set of power bus 30 (as depicted in FIG. 3), contact between carriage follower 22 and rotatable linkage 24 may cause the contact point between carriage follower 22 and rotatable linkage 24 to be at a second rotatable linkage position 44-2. If carriage assembly 8 is advanced to an extended position (i.e., the set of power connectors 14 is fully connected to the set of power buses 30 as depicted in FIG. 2), contact between carriage follower 22 and rotatable linkage 24 may cause the contact point between rotatable linkage 24 and adjustable carriage follower 22 to be at a third rotatable linkage position 44-3.

Still referring to FIG. 5, rotatable linkage 24 comprises operator handle blocking surface 46, wherein as rotatable linkage 24 rotates around pivot 42, a position of operator handle blocking surface 46 changes. Rotation of rotatable linkage 24 to any position between carriage follower positions 44-1 and 44-2 may position operator handle blocking surface 46 in a blocking position, wherein operator handle blocking surface 46 may prevent an operator from rotating operator handle 18 and accidentally energizing power unit 10. Rotation of rotatable linkage 24 to any position between carriage follower positions 44-2 and 44-23 may position operator handle blocking surface 46 in a nonblocking position, blocking surface 46 does not impede an operator from rotating operator handle 18.

Operator handle 18 may be rotatable about operator handle pivot 52 to an operator handle position 50-X. Operator handle 18 may be coupled to switch linkage 32 and switch actuator 34 to allow an operator to actuate power switch 36 to energize or de-energize power unit 10. An operator handle first position 50-1 may be associated with power unit 10 not being energized (i.e., an OFF position) and operator handle third position 50-3 may be associated with power unit 10 being energized (i.e., an ON position). Operator handle second position 50-2 may be associated with a set of power connectors 14 being in contact with (or near) power buses 30 but not fully connected. In some embodiments, operator handle 18 comprises operator handle extension 28 such that rotation of operator handle 18 around operator handle pivot 52 to an operator handle position 50-X causes operator handle extension 28 to rotate to an operator handle extension position 54-X.

As depicted in FIG. 5, power connection 100 may be configured such that the position of carriage follower 22 determines the angular position of rotatable linkage 24 and the angular position of rotatable linkage 24 determines a position of operator handle blocking surface 46. In some embodiments, if carriage assembly 8 is not fully extended or power connectors 14 are not fully connected to power buses 30, rotatable linkage 24 may rotate to any carriage follower position 44 between carriage follower positions 44-1 and 44-2. When rotatable linkage 24 is at any carriage follower position between first carriage follower position 44-1 and second carriage follower position 44-2, the angular position of second interface 26 positions blocking surface 46 in a blocking position to limit rotation of operator handle 18.

Referring to FIGS. 5 and 6, due to variations in production, carriage follower position 44-2 corresponding to power connectors 14 being in contact with, but not fully connected to, power buses 30 may vary. If carriage follower position 44-2 is closer to carriage follower position 44-3, an operator may be able to rotate operator handle 18 to operator handle third position 50-3 when power connectors 14 are not connected to power buses 30. If carriage follower position 44-2 is closer to carriage follower position 44-1, an operator may be unable able to rotate operator handle 18 to operator handle third position 50-3 even if power connectors 14 are fully connected to power buses 30. In some embodiments, carriage follower 22 may have an adjustable length to change the location of carriage follower position 44-2. FIG. 6 depicts a portion of one embodiment in which carriage follower 22 has an adjustable length (L). Carriage follower 22 may comprise an adjustable connection 62 allowing selected positioning between first carriage follower portion 22A and second carriage follower portion 22B to increase or decrease the length L of carriage follower 24.

In some embodiments, power unit 10 may be installed on a test unit and carriage assembly 8 may be advanced to a fully extended configuration. A technician may inspect the position of power connectors 14 relative to a set of (non-powered) test buses and verify that carriage follower 22 has length L configured to cause rotatable linkage 24 to rotate such that operator handle blocking surface 46 is in a nonblocking position. If operator handle blocking surface 46 is in a nonblocking position, hardware 62 may be tightened to ensure the length L of carriage follower 22 does not change. If operator handle blocking surface 46 is in a blocking position, hardware 62 may be loosened and second carriage follower portion 22B may be translated to decrease the length L of carriage follower 22 before tightening hardware 62 to ensure the length L of carriage follower 22 does not change. A technician may position carriage assembly 8 with power connectors 14 proximate to, but not in contact with, the set of test buses and verify that carriage follower 22 has length L configured such that operator handle blocking surface 46 is in a blocking position. If operator handle blocking surface 46 is in a blocking position, hardware 62 may be tightened to ensure the length L of carriage follower 22 does not change. If operator handle blocking surface 46 is in a nonblocking position, hardware 62 may be loosened and second carriage follower portion 22B may be translated to increase the length L of carriage follower 22 before tightening hardware 62 to ensure the length L of carriage follower 22 does not change.

Figure 7:
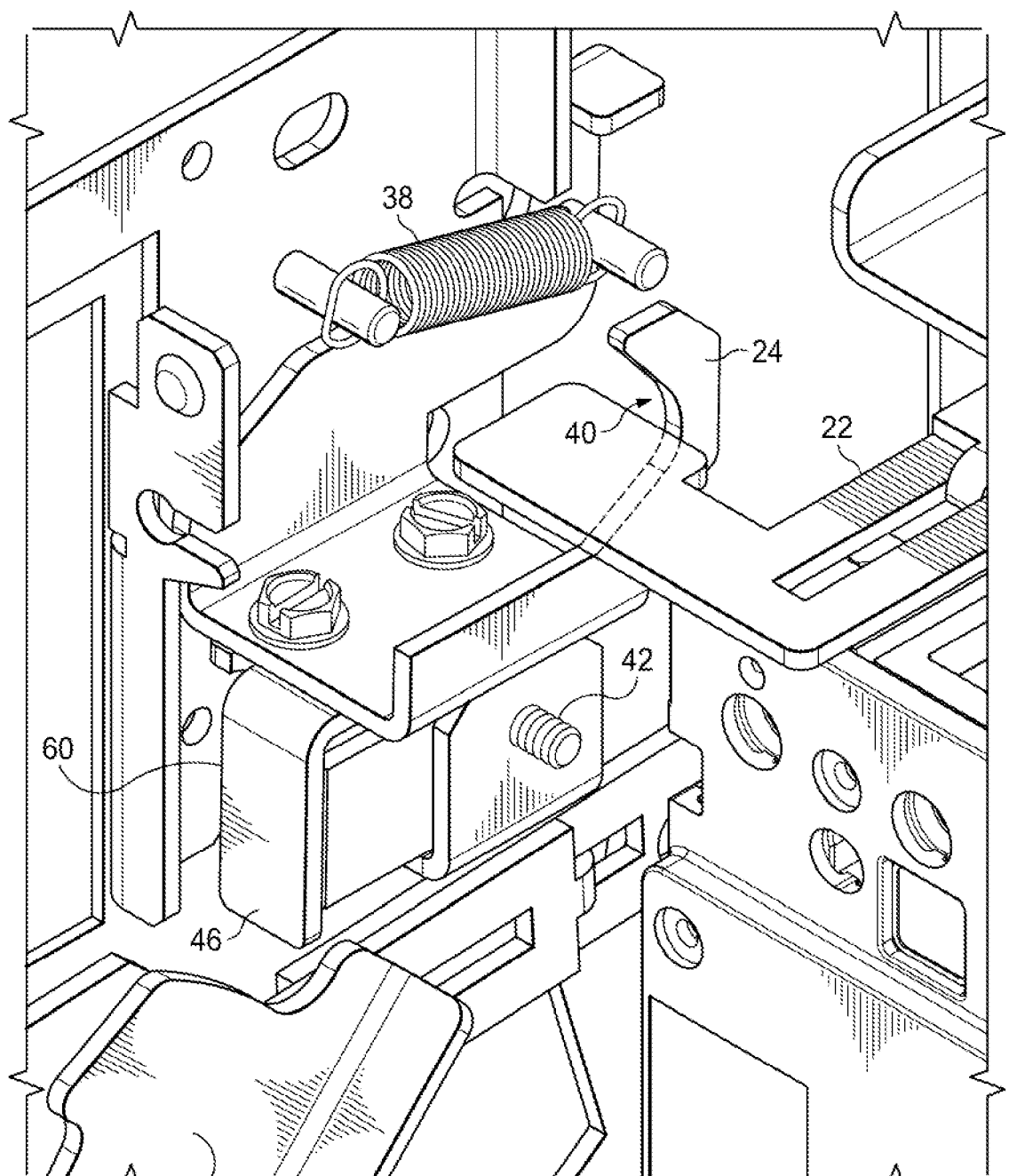
FIG. 7 is a closeup perspective view of an embodiment of the power connection depicted in FIG. 4.

Referring to FIGS. 6 and 7, rotatable linkage 24 may comprise contact surface 40 curved to cause rotatable linkage 24 to rotate around pivot 42 based on movement of carriage follower 22 toward power buses 30. In some embodiments spring 38 may be coupled to rotatable linkage 24 and housing 12 to bias rotatable linkage 24 in an opposite direction (e.g., toward a front of power unit 10) such that rotatable linkage 24 is biased to position operator handle blocking surface 46 in a blocking position.

Figure 8:
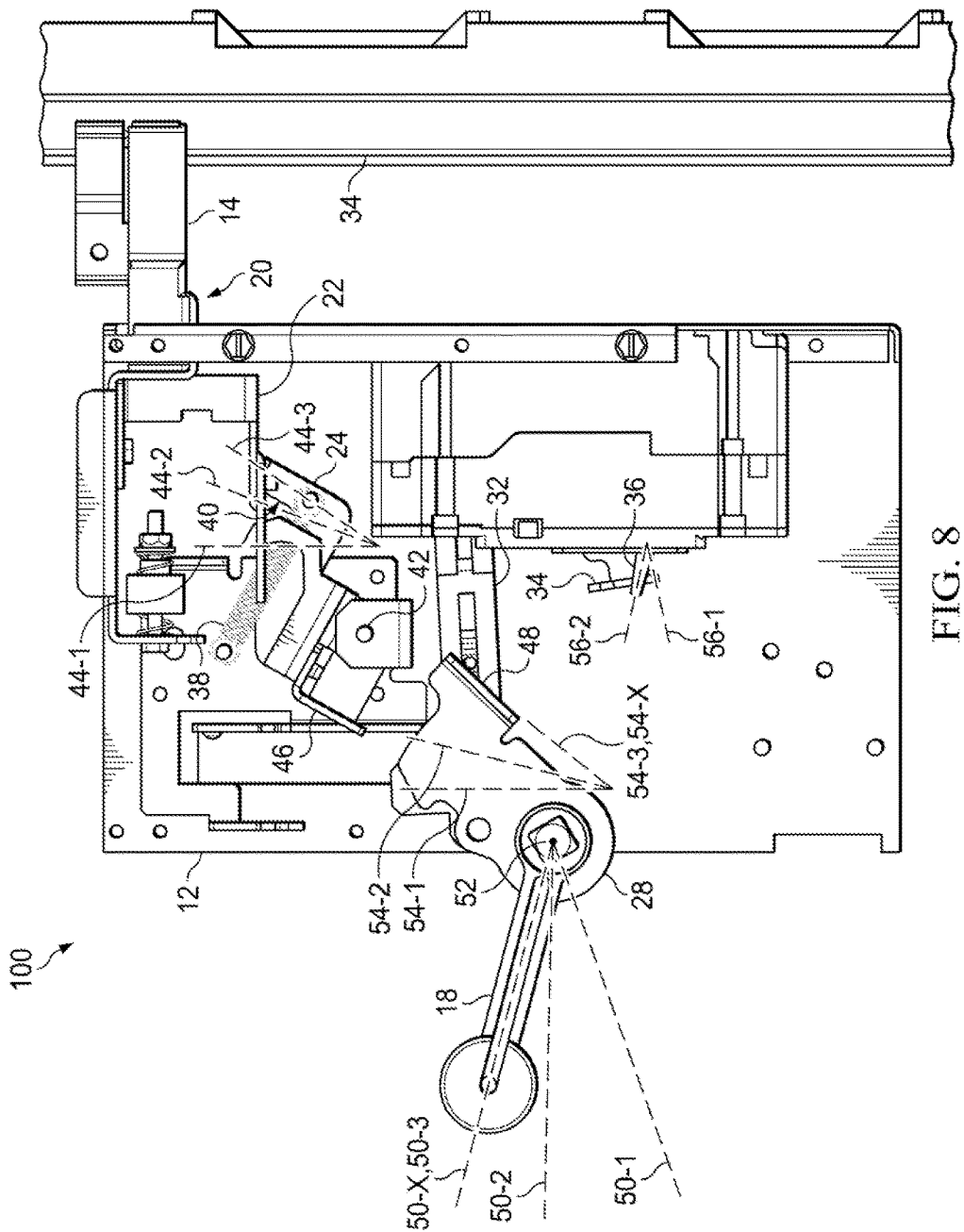
FIG. 8 is a side cutaway view of the embodiment of a power connection depicted in FIG. 4 in a configuration in which the operator handle is capable of being rotated to an ON position.

Referring to FIGS. 2 and 8, if carriage assembly 8 is advanced to an extended configuration such that a set of power connectors 14 is fully connected to a set of power buses rotatable linkage may be rotated such that blocking surface 46 is in a nonblocking position and does not impede rotation of operator handle extension 28 to operator handle third position Operator handle 18 may be rotated past operator handle second position 50-2 to operator handle third position 50-3, wherein rotation of operator handle 18 to operator handle third position 50-3 may cause switch position actuator 34 to position switch 36 in switch position 56-2 corresponding to power unit 10 being energized. Furthermore, contact between carriage follower 22 and rotatable linkage 24 may maintain rotatable linkage 24 at carriage follower position 44-3, wherein an operator may rotate operator handle 18 to any operator handle position 50-X between operator handle first position 50-1 and operator handle third position 50-3 as needed to actuate switch 36.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A power connection for a power unit associated with a motor control center, the power unit comprising a carriage assembly comprising a set of power connectors for connection to a set of power buses, a power switch for energizing the power unit when the set of power connectors are fully connected to the set of power buses, and a front panel encasing the power switch, the power connection comprising:
  an operator handle extending from the front panel, wherein the operator handle is rotatable to an operator handle position, and wherein an operator handle first position corresponds to the carriage assembly being in a position corresponding to the set of power connectors not in contact with the set of power buses, an operator handle second position corresponds to the set of power connectors positioned near the set of power buses and an operator handle third position corresponds to the set of power connectors being fully connected to the set of power buses;
  a carriage follower rigidly connected to the carriage assembly, wherein movement of the carriage assembly causes movement of the carriage follower;
  a rotatable linkage comprising:
    a positioning surface in contact with the carriage follower, wherein movement of the carriage follower causes rotation of the rotatable linkage; and
    an operator handle blocking surface, wherein
    if the carriage assembly is in an extended position corresponding to the set of power connectors being fully connected to the set of power buses, contact between the positioning surface and the rotatable linkage causes rotation of the rotatable linkage to position the operator handle blocking surface in a nonblocking position, wherein the operator handle is rotatable to the operator handle third position, and
    if the carriage assembly is in a retracted position corresponding to the set of power connectors not being fully connected to the set of power buses, the rotatable linkage positions the operator handle blocking surface in a blocking position, wherein the operator handle blocking surface prevents rotation of the operator handle to the operator handle third position.

2. The power connection of claim 1, wherein rotation of the rotatable linkage to position the operator handle blocking surface in the unblocked position is possible only when the set of power connectors is fully connected to the set of power connectors.

3. The power connection of claim 1, wherein:
  the rotatable linkage is rotatable around a first pivot; and
  the positioning surface is curved.

4. The power connection of claim 1, wherein the carriage follower has a length configurable such that the rotation of the rotatable linkage positions the operator handle blocking surface in the nonblocking position.

5. The power connection of claim 1, further comprising a spring configured to bias the rotatable linkage to the blocking position.

6. The power connection of claim 1, wherein the operator handle is coupled to a switch actuator, and wherein rotation of the operator handle to the operator handle third position causes the switch actuator to configure the power switch to energize the power unit.

7. The power connection of claim 6, further comprising a handle extension coupled to the operator handle and the switch actuator, wherein a change in the operator handle position causes a proportional change in an angular position of the handle extension,
and if the set of power connectors are not fully connected to the set of power buses, rotation of the operator handle from the operator handle first position toward the operator handle third position causes the operator handle extension to contact the operator handle blocking surface, and wherein the operator handle blocking surface prevents rotation of the operator handle to the operator handle third position.

8. The power connection of claim 7, wherein the handle extension is fixed at an angle relative to the operator handle.

9. A power unit for a motor control center having a set of power buses, the power unit comprising:
a carriage assembly comprising a set of power connectors for connection to a set of power buses;
a power switch configurable for energizing the power unit when the set of power connectors are fully connected to the set of power buses;
a front panel encasing the power switch;
an operator handle extending from the front panel, wherein the operator handle is rotatable to an operator handle position, and wherein an operator handle first position corresponds to the carriage assembly being in a position corresponding to the set of power connectors not in contact with the set of power buses, an operator handle second position corresponds to the set of power connectors positioned near the set of power buses and an operator handle third position corresponds to the set of power connectors being fully connected to the set of power buses;
a carriage follower rigidly connected to the carriage assembly, wherein movement of the carriage assembly causes movement of the carriage follower;
a rotatable linkage comprising:
a positioning surface in contact with the carriage follower, wherein movement of the carriage follower causes rotation of the rotatable linkage; and
an operator handle blocking surface, wherein
if the carriage assembly is in an extended position corresponding to the set of power connectors being fully connected to the set of power buses, contact between the positioning surface and the rotatable linkage causes rotation of the rotatable linkage to position the operator handle blocking surface in a nonblocking position, wherein the operator handle is rotatable to the operator handle third position, and
if the carriage assembly is in a retracted position corresponding to the set of power connectors not being fully connected to the set of power buses, the rotatable linkage positions the operator handle blocking surface in a blocking position, wherein the operator handle blocking surface prevents rotation of the operator handle to the operator handle third position.

10. The power unit of claim 9, wherein
the rotatable linkage is rotatable around a first pivot; and
the positioning surface is curved.

11. The power unit of claim 9, wherein the carriage follower is configurable such that rotation of the rotatable linkage to position the operator handle blocking surface in the unblocked position is possible only when the set of power connectors is fully connected to the set of power buses.

12. The power unit of claim 11, wherein the carriage follower has a length configurable such that the rotation of the rotatable linkage positions the operator handle blocking surface in the nonblocking position when the set of power connectors are fully connected to the set of power buses.

13. The power unit of claim 9, further comprising a spring configured to bias the rotatable linkage to the blocking position.

14. The power unit of claim 9, wherein the operator handle is coupled to a switch actuator, and wherein rotation of the operator handle to the operator handle third position causes the switch actuator to configure the power switch to energize the power unit.

15. The power unit of claim 14, further comprising a handle extension coupled to the operator handle and the switch actuator, wherein a change in the operator handle position causes a proportional change in an angular position of the handle extension,
and if the set of power connectors are not fully connected to the set of power buses, rotation of the operator handle from the operator handle first position toward the operator handle third position causes the operator handle extension to contact the operator handle blocking surface, and wherein the operator handle blocking surface prevents rotation of the operator handle to the operator handle third position.

16. The power unit of claim 15, wherein the handle extension is fixed at an angle relative to the operator handle.

17. A method for connecting a power unit to a set of power buses in a motor control center, the power unit comprising a set of power connectors for connecting to the set of power buses, a unit housing comprising components, a power switch configurable for energizing the power unit when the set of power connectors are fully connected to the set of power buses, and a front panel encasing the power switch, the method comprising:
positioning a power unit relative to the set of power buses, wherein the power unit comprises:
a carriage assembly comprising a set of power connectors for connection to the set of power buses, wherein the power unit is positionable relative to the set of power buses with the carriage assembly in a retracted configuration;
an operator handle extending from the front panel, wherein the power unit is positionable relative to the set of power buses with the operator handle in an operator handle first position corresponding to the set of power connectors not in contact with the set of power buses;
a carriage follower rigidly connected to the carriage assembly, wherein movement of the carriage assembly causes movement of the carriage follower;

a rotatable linkage comprising:
- a positioning surface in contact with the carriage follower, wherein movement of the carriage follower causes rotation of the rotatable linkage; and
- an operator handle blocking surface, wherein the rotatable linkage is rotatable to position the operator handle blocking surface in a blocking position to prevent rotation of the operator handle to an operator handle second position corresponding to the set of power connectors positioned near the set of power buses; and
- movement of the rotatable linkage causes rotation of the rotatable linkage; and advancing the carriage assembly to fully connect the set of power connectors to the set of power buses, wherein the rotatable linkage positions the operator handle blocking surface in a nonblocking position such that the operator handle is rotatable to an operator handle third position to energize the power unit.

18. The method of claim 17, wherein the operator handle is coupled to a switch actuator coupled to the power switch, and wherein rotation of the operator handle to the operator handle third position causes the switch actuator to configure the power switch to energize the power unit.

19. The method of claim 18, further comprising a handle extension coupled to the operator handle and the switch actuator, wherein a change in the operator handle position causes a proportional change in an angular position of the handle extension,
- if the set of power connectors are not fully connected to the set of power buses, rotation of the operator handle from the operator handle first position toward the operator handle third position causes the operator handle extension to contact the operator handle blocking surface to prevent rotation of the operator handle to the operator handle third position.

20. The method of claim 17, wherein the carriage follower has a length configurable such that advancing the carriage assembly causes rotation of the rotatable linkage to position the operator handle blocking surface in the nonblocking position only if the set of power connectors are fully connected to the set of power buses.

* * * * *